United States Patent [19]

Moss et al.

[11] 4,038,171

[45] July 26, 1977

[54] SUPPORTED PLASMA SPUTTERING APPARATUS FOR HIGH DEPOSITION RATE OVER LARGE AREA

[75] Inventors: Ronald W. Moss; Edwin D. McClanahan, Jr.; Nils Laegreid, all of Richland, Wash.

[73] Assignee: Battelle Memorial Institute, Columbus, Ohio

[21] Appl. No.: 672,402

[22] Filed: Mar. 31, 1976

[51] Int. Cl.² .......................... C23C 15/00
[52] U.S. Cl. .................................. 204/298
[58] Field of Search ...................... 204/192, 298

[56] References Cited

U.S. PATENT DOCUMENTS

| | | | |
|---|---|---|---|
| 3,393,142 | 7/1968 | Moseson | 204/298 |
| 3,501,393 | 3/1970 | Wehner et al. | 204/298 |
| 3,514,391 | 5/1970 | Hablanian et al. | 204/298 |
| 3,583,899 | 6/1971 | Aronson | 204/298 |
| 3,616,452 | 10/1971 | Pessot et al. | 204/298 |
| 3,661,758 | 5/1972 | Jackson et al. | 204/298 |
| 3,707,452 | 12/1972 | Lester et al. | 204/192 |
| 3,711,398 | 1/1973 | Clarke | 204/298 |
| 3,763,031 | 10/1973 | Scow et al. | 204/298 |
| 3,779,891 | 12/1973 | Vegh et al. | 204/298 |
| 3,856,579 | 12/1974 | Allen et al. | 148/103 |
| 3,901,784 | 8/1975 | Quinn et al. | 204/192 |

FOREIGN PATENT DOCUMENTS 1,104,770 2/1968 United Kingdom ................ 204/298

OTHER PUBLICATIONS

E. D. McClanahan et al., "Initial Work on the Application of Protective Coatings to Marine Gas Turbine Components by High-Rate Sputtering", Am. Soc. Mech. Eng. (1974).

D. H. Grantham et al., "High-Rate rF Sputtering System", J. Vac. Sci. Tech., vol. 7, pp. 343-346, (1969).
T. C. Tisone et al., "Low-Voltage Triode Sputtering with a Confined Plasma", J. Vac. Sci. Tech., vol. 12, No. 5, pp. 1058-1066, Sept./Oct. 1975.

Primary Examiner—John H. Mack
Assistant Examiner—Aaron Weisstuch
Attorney, Agent, or Firm—Klarquist, Sparkman, Campbell, Leigh, Hall & Whinston

[57] ABSTRACT

A supported plasma sputtering apparatus is described having shaped electrical fields in the electron discharge region between the cathode and anode and the sputter region between the target and substrate while such regions are free of any externally applied magnetic field to provide a high deposition rate which is substantially uniform over a wide area. Plasma shaping electrodes separate from the anode and target shape the electrical fields in the electron discharge region and the sputter region to provide a high density plasma. The anode surrounds the target to cause substantially uniform sputtering over a large target area. In one embodiment the anode is in the form of an annular ring surrounding a flat target surface, such anode being provided with a ribbed upper surface which shields portions of the anode from exposure to sputtered material to maintain the electron discharge for a long stable operation. Several other embodiments accomplish the same result by using different anodes which either shield the anode from sputtered material, remove the sputtered coating on the anode by heating, or simultaneously mix sputtered metal from the auxiliary target with sputtered insulator from the main target so the resultant coating is conductive. A radio frequency potential alone or together with a D.C. potential, may be applied to the target for a greater sputtering rate.

15 Claims, 7 Drawing Figures

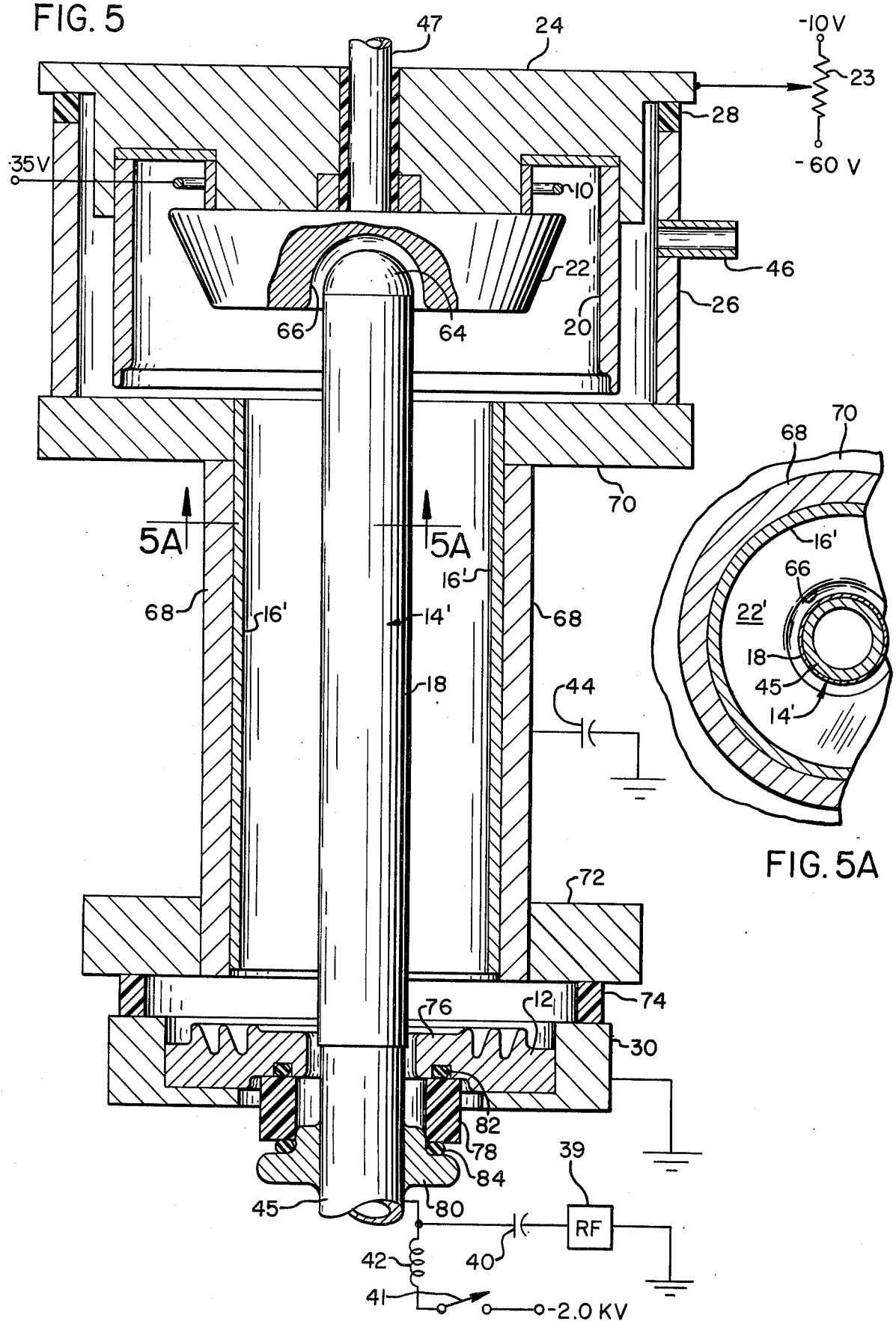

SUPPORTED PLASMA SPUTTERING APPARATUS FOR HIGH DEPOSITION RATE OVER LARGE AREA

BACKGROUND OF THE INVENTION

The subject matter of the present invention relates generally to a supported plasma sputtering apparatus which is capable of high deposition rates over a wide area, and in particular to triode sputtering apparatus having plasma shaping electrodes to provide a high density plasma without the use of any externally applied magnetic field to enable a more uniform deposition of sputtered material over a wide area. A "supported plasma" sputtering apparatus is one in which the plasma is maintained or supported by an electron discharge from a thermionic cathode to an anode and the sputtering target is immersed in such plasma. The plasma shaping electrodes shape the electrical field in the electron discharge region between the cathode and anode and in the sputter region between the target and substrate member to provide a high density plasma which increases the sputter deposition rate and enables a large area deposit of substantially uniform thickness. A radio frequency potential may be applied to the target to increase the sputtering rate and apparently increase the plasma density, which results in improved deposit thickness uniformity and greater deposit density, partially due to lower pressure. A long stable sputtering operation is achieved by maintaining the electron discharge using different types of anodes surrounding the target, which either shield anode surface portions from exposure to sputtering material or remove sputtered coatings on the anode by heating, or to simultaneously mix sputtered metal from the auxiliary target with sputtered insulator from the main target so that the resultant coating is conductive.

The sputtering apparatus of the present invention is especially useful in sputtering metal, insulator or semiconductor materials over large areas, such as during the formation of solar panel photocells for the conversion of light to electrical power.

Previously it has been proposed in the article, "High Rate RF Sputtering System", *Journal of Vacuum Science and Technology*, Volume 7, No. 2, by D. H. Grantham et al, pages 343–346, published 1969, and in U.S. Pat. No. 3,901,784 of D. J. Quinn et al, granted Aug. 26, 1975, to deposit insulating material at a high deposition rate using radio frequency power. However, a magnetic field was provided in the sputter region to increase the deposition rate and no plasma shaping electrodes were employed so that a relatively small target area was sputtered and the sputtered deposit on the substrate would have a nonuniform thickness. Similar results would be achieved by triode sputtering apparatus shown in U.S. Pat. No. 3,514,391 of Hablanian et al and U.S. Pat. No. 3,616,452 of Bessot et al, both of which apply radio frequency fields to insulating targets but employ magnetic fields in the sputter region which would result in a small area deposition and would produce nonuniform thickness deposits. An R.F. sputtering apparatus using a finned or ribbed anode to prevent sputtered material from completely coating such anode is shown in U.S. Pat. No. 3,514,391 and in the article, "Initial Work on the Application of Protective Coatings to Marine Gas Turbine Components by High Rate Sputtering", by E. D. McClanahan et al in publication 74-GT-100 of the American Society of Mechanical Engineers, published March, 1974. None of these prior references disclose the use of plasma shaping electrodes separate from the anode which are connected to a more negative potential and shape the electrical fields in the electron discharge region and sputter region to increase the plasma density without using a magnetic field in the manner of the present invention.

SUMMARY OF INVENTION

It is therefore one object of the present invention to provide an improved sputtering apparatus for achieving high sputtering deposition rates over large areas.

Another object of the invention is to provide such an improved sputtering apparatus using plasma shaping electrodes separate from the anode and target to shape the electrical field in the electron discharge region between the cathode and anode and in the sputter region between the target and substrate to provide a high density plasma without the use of a magnetic field.

A further object of the present invention is to provide such a sputtering apparatus which provides a more uniform thickness deposition over a wider area.

An additional object of the invention is to provide such a sputtering apparatus which is capable of a stable sputtering operation for a long period of time.

Still another object of the invention is to provide a sputtering apparatus which accomplishes such stable operation by employing different types of anodes which either shield anode surface portions from exposure to sputtering material or remove sputtered material coated on the anode by heating such anode or coating the anode with conducting material sputtered from an auxiliary target.

A still further object of the invention is to provide such a sputtering apparatus in which a radio frequency electrical potential is applied to the target to increase the sputtering rate.

BRIEF DESCRIPTION OF DRAWINGS

Other objects and advantages of the present invention will be apparent from the following detailed description of certain preferred embodiments thereof and from the attached drawings of which:

FIG. 5 is a section view of a fifth embodiment of the present invention employing a cylindrical target; and FIG. 5A is a partial horizontal section view taken along the line 5A—5A of FIG. 5.

DESCRIPTION OF PREFERRED EMBODIMENTS

Figure 1:
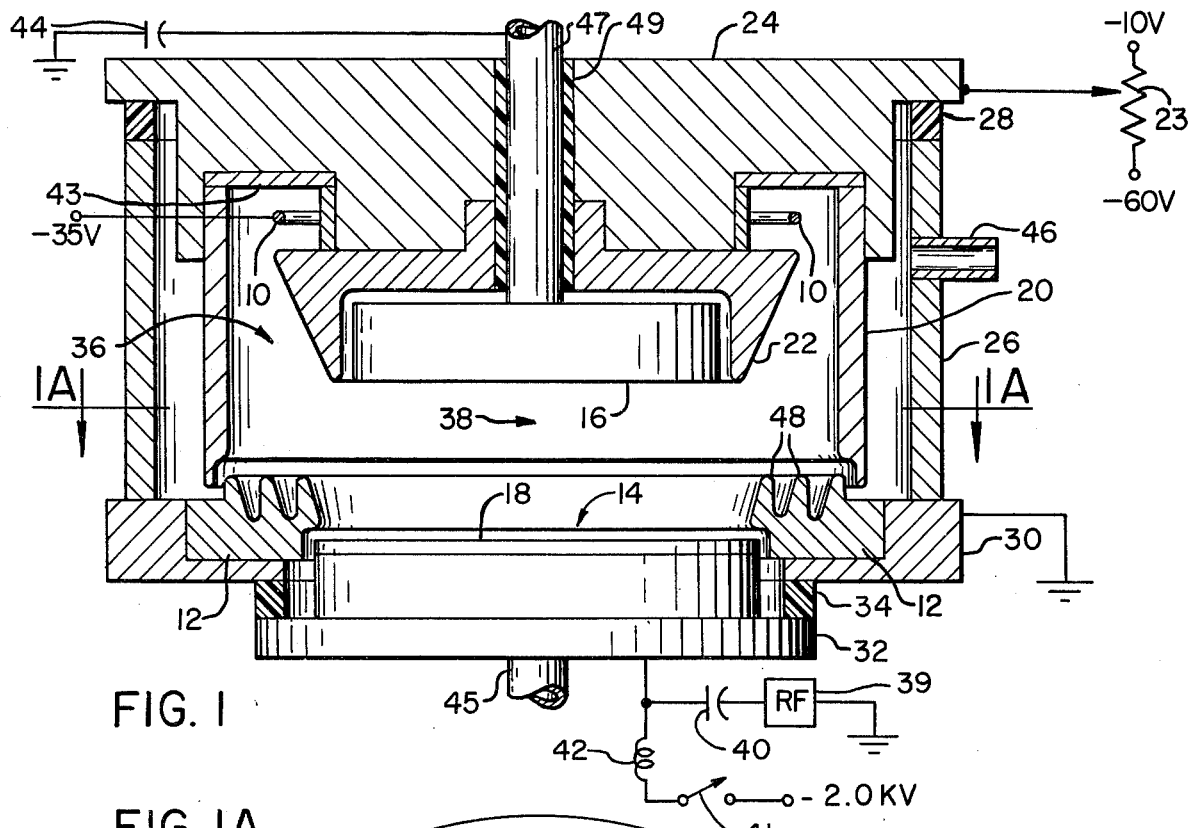
FIG. 1 is a sectional view of one embodiment of the triode sputtering apparatus of the present invention.
Figure 1A:
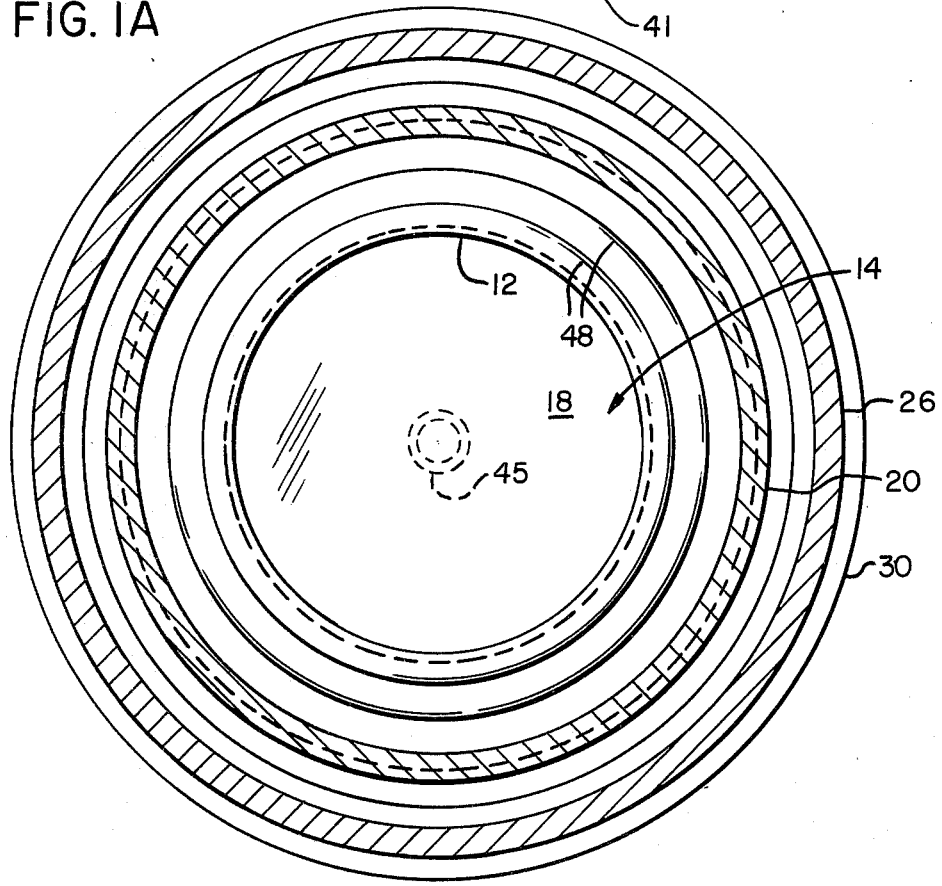
FIG. 1A is a horizontal section view taken along the line 1A—1A of FIG. 1.

As shown in FIGS. 1 and 1A, one embodiment of the triode sputtering apparatus of the present invention includes an annular heated filament type cathode 10 serving as a source of electrons, a ring-shaped anode 12 surrounding a flat annular target 14, and a flat annular substrate 16. The target 14 has its upper surface coated with a layer 18 of metal, insulator or semiconductor material to be sputtered, hereinafter called the "sputtering layer". A pair of annular first and second plasma shaping electrodes 20 and 22 are provided with electrode 22 being of a cup-shape surrounding the substrate 16 and the electrode 20 being in the form of a cylinder surrounding said coaxial with cathode 10, anode 12, substrate 16, and target 18. These plasma shaping electrode are releasably attached by bolts or the like to a common support member 24 which may be made of metal and serves as the top portion of a sealed, evacuated envelope enclosing the sputtering apparatus and containing inert gas at a low pressure of about 1 to 5 millitorr.

The envelope also includes a cylindrical envelope wall member 26 attached at its upper end to the support member 24 by an insulator ring 28. The envelope wall member 26 is attached at its lower end to an anode support ring 30. The anode 12 is releasably attached to support ring 30 and such ring is made of metal for applying an electrical potential to such anode, which is usually grounded. The anode support ring 30 is connected to a target support plate 32 through an insulator ring 34 so that the target may be maintained at a high negative D.C. potential with respect to the anode for sputtering purposes.

Positive ions of inert gas are produced by the electron discharge from the filament cathode 10 to the anode 12 to produce a plasma in an annular shaped principal electron discharge region 36 surrounding the target 14, such region containing the major portion of the cathode to anode electron discharge for supporting or maintaining the plasma. These positive ions bombard the sputtering layer 18 on the surface of the target 14 to cause material to be sputtered from such target onto the substrate 16 through a centrally located sputter discharge region 38. Substrate 16 can be D.C. biased or R.F. self-induced biased to about −500 volts, but is preferably floating and assumes a bias of about −25 volts, as hereafter described. It should be noted that the plasma produced in the principal electron discharge region 36 surrounds and is distributed evenly over the sputter discharge region 38 and the target 14 for efficient uniform sputtering.

The target 14 is preferably connected to a radio frequency (R.F.) signal A.C. power supply 39 through a coupling capacitor 40 of a few picofarads. In addition, for depositing conductor or semiconductor material, the target may be connected to a source of negative D.C. voltage of, for example, −2.0 kilovolts through a switch 41 and an isolating inductance 42 so that such D.C. source and R.F. power supply are isolated from each other. One suitable R.F. power supply is a 10 kilovolts peak to peak amplitude R.F. power supply having a frequency of about 13.56 megahertz. This R.F. signal produced by the R.F. power supply induces an average D.C. voltage of about −2.5 to −5.0 kilovolts on the surface of the sputtering layer 18 in the manner described by H.S. Butler et al in Physics of Fluids, Volume 6, No. 9, Sept. 1963, pages 1346 to 1355. As stated earlier, the anode 12 is typically grounded. The filament cathode 10 is connected to a small negative D.C. potential of typically about −35 volts. The plasma shaping electrodes 20 and 22 are connected by a potentiometer 23 to a D.C. potential of about −25 volts to +25 volts relative to the cathode 10 and in the example given, would be of a D.C. voltage between −10 volts and −60 volts with respect to ground. However, it is also possible to provide such plasma shaping electrode so that they are floating in electrical potential and assume a negative D.C. potential of about −25 volts. The plasma shaping electrodes are negative with respect to the anode and accordingly repel electrons emitted by the cathode 10 toward the anode 12. Because of the presence of positive ions of inert gas in the electron discharge region 36, the plasma shaping electrodes 20 and 22 are not at a highly negative potential because this would result in the sputtering of metal from such electrodes due to positive ion bombardment.

The annular ring-shaped filament cathode 10 is contained within a cavity formed by the plasma shaping electrodes 20, 22, and their support member 24 so that substantially all of the electrons emitted by the cathode 10 are repelled from the surface of such cavity and directed towards the anode. This increases the electron flow to such anode and also increases the density of the plasma formed by such electrons and the positive ions of inert gas in such electron discharge region because of the greater ionization caused by the increased electron flow through the discharge region. It should be noted that the cavity surface of the support member 24 may be covered by shield plates 43 releasably attached thereto for replacement along with the electrodes 20, 22 and anode 12 when they become coated with sputtered material. The radio frequency signal applied to the target further increases ionization of the inert gas molecules by the electrons resulting in an even higher density plasma which increases the number of positive ions of inert gas which bombard the target. In the example given, incident target power densities of 50 to 100 watts/cm$^2$ were obtained. The result is that the sputtering apparatus of the present invention has an extremely high sputter deposition rate over a large area of the target which is maintained substantially uniformly across such target area due to the fact that no external magnetic field is applied to the sputtering apparatus so that the electron discharge region 36 and the sputter discharge region 38 are free of any such magnetic field.

The substrate 16 is of a floating D.C. potential and is A.C. grounded through an R.F. signal bypass capacitor 44 of about .1 microfarads. The floating D.C. potential on the substrate 16 under typical operating conditions is about −25 volts. The target of the above example was approximately 12.7 centimeters in diameter while the bombarded area of the target was approximately 11.1 centimeters in diameter, giving a total effective target area of about 100 square centimeters. However, the effective sputtering target area can be increased considerably using higher R.F. power supplies. Target sizes of approximately 500 to 700 square centimeters can be used with commercially available R.F. power supplies on the order of 30 to 35 kilowatts, which maintain a high sputtering rate over the larger area.

An inert gas, such as krypton or argon, is supplied to the interior of the vacuum chamber through a coupling 46 in the side wall 26 and such chamber is normally maintained at a low pressure of between 1 to 5 millitorr, 4 millitorr being typical for krypton, by means of a vacuum pump connected to such housing through coupling 46. The target and the substrate may have their temperatures regulated such as by water cooling in the conventional manner through hollow support stems 45 and 47. The target temperature is typically held at about 25° Celsius while the substrate temperature varies over a wide range of between about −100° to +900° Celsius, depending on the materials being deposited.

The anode to cathode spacing in the embodiment of FIG. 1 is about 7.62 centimeters, while the target to substrate spacing may be adjusted from about 2.54 to 6.35 centimeters and is typically set at about 4.12 centimeters. The substrate support stem 47 is sealed to the electrode support 24 by an insulative sleeve 49 which spaces the stem from such support by about 0.317 centimeters. The anode is spaced from the target approximately 0.317 to 0.635 centimeters for electrical insulation purposes and in the preferred embodiment may have its upper surface slightly raised above the upper surface of the target as shown.

Using the above described apparatus, high deposition rates on the order of 15,000 Angstroms per minute for metals and metal alloys were achieved, which can be increased to 25,000 Angstroms per minute with a greater R.F. signal power supply of, for example, 15 kilowatts power. This compares with a high of approximately 1000 Angstroms per minute deposition rate for a conventional R.F. diode sputtering system. Similarly, high deposition rates were obtained for insulating materials. Thus, a deposition rate of 2000 Angstroms per minute was obtained for aluminum oxide and 4000 Angstroms per minute was achieved for zirconium oxide. An even greater deposition rate could be achieved for insulators up to approximately 8000 Angstroms per minute using a greater R.F. power supply of 15 kilowatts. This increased deposition rate for insulators compares to a maximum deposition rate of about 500 Angstroms per minute for conventional R.F. diode sputtering systems.

In addition to the increased sputtering rate, the sputtered deposit has a substantially uniform thickness of plus or minus 5% variation over much larger areas. To date these results have been achieved for targets of 110 $cm^2$ and we feel confident that similar results can be achieved on much larger targets of up to 500 to 700 $cm^2$ using larger R.F. power supplies. It is also possible to deposit semiconductor materials at similar high deposition rates and large areas of substantially uniform thickness.

As shown in FIG. 1, the anode 12 may be provided with a ribbed upper surface 48 in order to prevent the deposition of sputtered insulating material over the entire surface of the anode which would otherwise stop the electron discharge from the cathode to such anode. Thus, the tops of the ribs or ridges at the upper surface of the anode shield the valley portions of such ridges from the deposition of sputtered material. As a result, electron discharge between the cathode and anode is not prevented, which enables a long stable sputtering operation. In this regard, the ribbed anode 48 is similar to the anode used in the R.F. sputtering apparatus of U.S. Pat. No. 3,514,391 of Hablanian et al.

Figure 2:
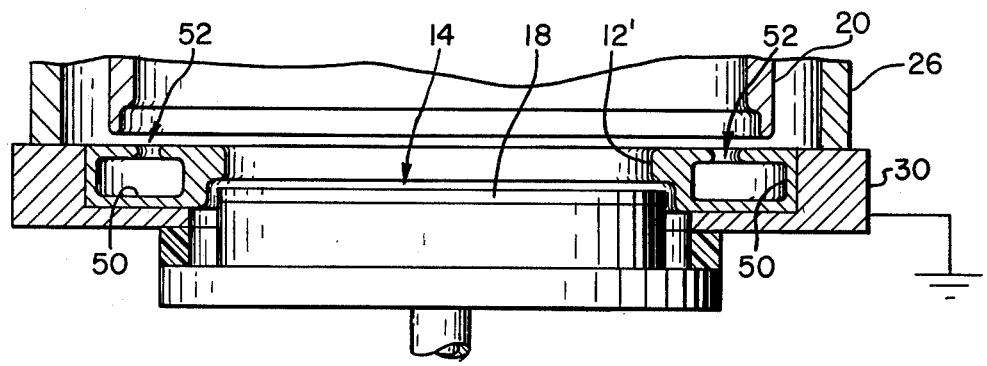
FIG. 2 is a section view of a second embodiment of the sputtering apparatus of the present invention employing a different type anode.

FIG. 2 shows another embodiment of the sputtering apparatus similar to that of FIG. 1 which employs a modified anode 12' but is otherwise similar to the embodiment of FIG. 1. Anode 12' has an annular internal cavity 50 of rectangular cross section into which the electrons enter through a restricted opening 52 in the top of such cavity. As a result of the restricted opening 52, very little sputtered material enters the cavity 50 and is deposited on the surface of the cavity. This enables the electron discharge from the filament cathode 10 to the anode 12' to be maintained for a longer stable operation. Of course, the sputtered material will eventually coat the entire cavity 50 which will stop the electron discharge if it is an insulator, but this will take a very long time. In the meantime the electrons emitted from the cathode 10 pass through the restricted opening 52 and strike the anode surface within the cavity 50 to maintain the sputtering action. It should be noted that in both the embodiments of FIGS. 1 and 2, the shape of the outer plasma shaping electrode 20 may be changed somewhat from that shown so that the bottom end of such electrode projects inward over the upper surface of the anode to further shield the anode from the deposition of sputtered material.

Figure 3:
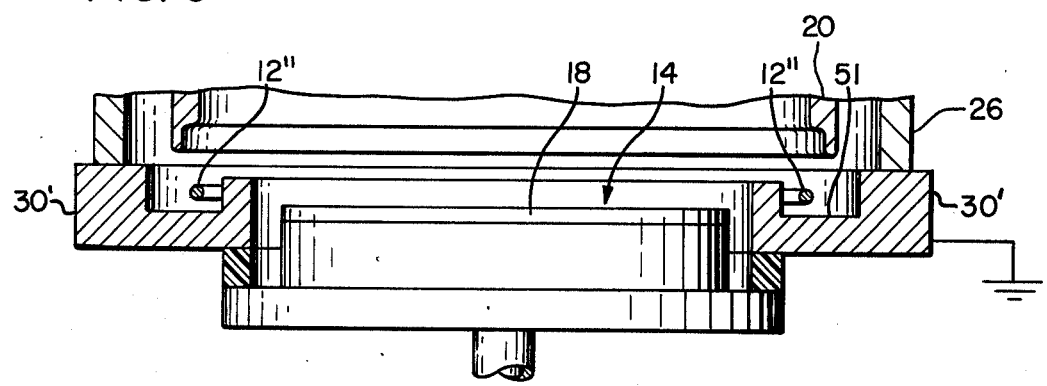
FIG. 3 is a section view of a third embodiment of the present invention employing an anode in the form of a wire which is heated to remove sputtered material deposited thereon.

A third embodiment of the sputtering apparatus of the present invention, shown in FIG. 3, is similar to that of FIG. 1, except for the use of a second modified anode 12" which is in the form of an annular metal wire of tungsten or other refractory metal. The wire anode 12" is mounted within an annular cavity 51 of rectangular cross section formed in the anode support member 30' by extending the inner edge of such support member upward to shield the anode wire from the target layer 18. The wire anode is heated either by electron bombardment with electrons emitted by the cathode 10 or by electrical current flowing through such anode wire from a conventional A.C. source of heating current (not shown). As a result of this heating of the wire anode, any sputtered material deposited on such anode is removed by evaporation.

Figure 4:
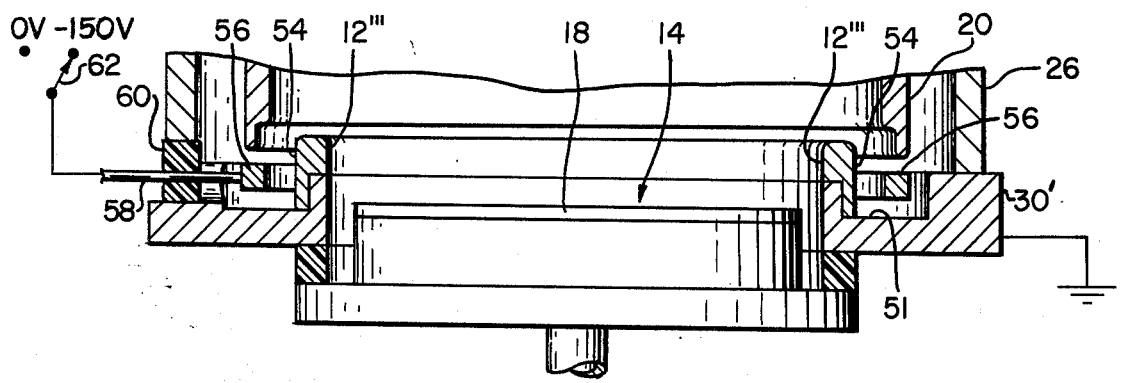
FIG. 4 is a section view of a fourth embodiment of the present invention employing an auxiliary sputtering target for coating the anode with metal after it is coated with a layer of sputtered insulating material from the main target.

A fourth embodiment of the present invention is shown in FIG. 4, which is similar to that of FIG. 1 except that is employs a third modified anode 12'''. The anode 12''' is in the form of an annular ring releasably attached to the anode support 30' so that its outer surface 54 faces an auxiliary target 56. The auxiliary target 56 is in the form of an annular ring mounted within the cavity 51 in the anode support 30' and surrounding the anode. The auxiliary target 56 is made of a suitable conductor which, upon the application of a negative D.C. potential to such auxiliary target, is sputtered from such target onto the surface 54 of the anode. This results in maintaining a reasonably conductive surface on such anode by changing any sputtered insulator coating formed of such anode into a conductive coating. As a result, this insulating material does not prevent an electron discharge between the filament cathode 10 and the anode. An electrical lead 58 extends through an insulating seal 60 in the side of the envelope wall 26 in order to apply a negative D.C. potential of about −150 volts in the range of −50 volts to −500 volts in the sputter position of switch 62 shown. In the other position of switched 62, the auxiliary agent is deenergized.

A fifth embodiment of the sputtering apparatus of the present invention is shown in FIG. 5. This embodiment is similar to that of FIG. 1 except that it employs a cylindrical target 14' which is mounted with its longitudinal axis coaxial with a surrounding cylindrical substrate member 16'. In this embodiment, it should be noted that the electron discharge region between filament 10 and anode 12 extends substantially perpendicular to the sputter discharge region extending between target 14' and substrate 16'. The upper end of the cylindrical target member 14' is provided with a hemispherical end portion 64 which is uniformly spaced from a corresponding hemispherical cavity 66 in the modified plasma shaping electrode 22' sufficiently to prevent electrical discharges between these members. The substrate cylinder 16' is mounted on the inner surface of the cylindrical metal support 68, whose upper end is joined to the envelope side wall 26 by an annular metal ring member 70 and whose lower end is joined to a second annular metal ring member 72. The substrate 16' and its support members 68, 70, and 72 are floating in electrical potential and normally assume a negative D.C. potential of about −30 volts so that they repel the electrons transmitted from cathode 10 across the surface of the substrate to anode 12.

An annular insulator ring 74 connects the support ring 72 to the anode support 30 and electrically insulates these members from one another. The ribbed anode 12 is provided with an inner flange portion 76 which is supported on the upper edge of another insulator ring 78 whose lower edge is supported on an outer flange 80 projecting outward from the target support stem 45. A pair of rubber 0 rings 82 and 84 are provided between the insulator ring 78 and flanges 76 and 80 respectively, to form gas tight seals therewith. Similar 0 rings are also present between all adjacent separate members of the envelopes in FIGS. 1 to 5, but are not shown to simplify the drawings. A vacuum envelope is formed containing an inert gas, such as krypton or argon, at a low pressure of 1 to 5 millitorr provided by the vacuum pump and gas source connected to coupling 46.

The embodiment of the sputtering apparatus shown in FIG. 5 has the advantage that it is capable of coating an even larger area of the substrate than the embodiments of FIGS. 1 to 4. In all embodiments, plasma shaping electrodes are employed to shape the electrical field in the electron discharge region between the cathode and anode and in the sputter region between the target and substrate to provide a high plasma density without using an externally applied magnetic field. The result is a high deposition rate giving high density sputter deposits of large area and substantially uniform thickness in all of these embodiments.

It will be obvious to those having ordinary skill in the art that many changes may be made in the above-described preferred embodiments of the present invention without departing from the spirit of the invention. Therefore, the scope of the present invention should only be determined by the following claims.

We claim:
1. Sputtering apparatus comprising:
cathode means for emitting electrons;
annular anode means spaced from the cathode means by an electron discharge region through which said electrons pass from said cathode to said anode;
target means for supporting target material to be sputtered, said target means being surrounded by said annular anode and separate therefrom;
substrate support means separate from said anode and spaced from said target means by a sputter region through which sputtered material passes from said target to said substrate;
means for providing sputtering gas in the said electron discharge region and said sputter region which is ionized by said electrons to produce a plasma including positive ions of said sputtering gas which bombard said target to sputter the material thereon from said target onto said substrate;
plasma shaping electrode means surrounding said target and said substrate, said plasma shaping electrode being separate from said anode and electrically insulated therefrom; and
means for applying an electrical potential to said plasma shaping electrode means different than the potential applied to said anode to produce electrical fields in the electron discharge region and the sputter region, said electrical fields repelling electrons from said shaping electrode to said anode and shaping said plasma to cause said positive ions to be distributed more uniformly over a large target area.

2. Sputtering apparatus in accordance with claim 1 in which said cathode is surrounded by said plasma shaping electrode means except for said electron discharge region between the cathode and the anode and said electron discharge region and said sputter discharge region are free of any externally applied magnetic field.

3. Sputtering apparatus in accordance with claim 1 in which said target means is connected to an electrical power supply including an A.C. voltage source of radio frequency.

4. Sputtering apparatus in accordance with claim 3 in which said power supply also includes a D.C. voltage source.

5. Sputtering apparatus in accordance with claim 1 in which said plasma shaping electrode means is connected to a D.C. voltage which is negative with respect to that of the anode means.

6. Sputtering apparatus in accordance with claim 5 in which said plasma shaping electrode means includes electrode means surrounding the substrate means except for said sputter region and surrounding said electron discharge region.

7. Sputtering apparatus in accordance with claim 1 in which said anode means is an annular ring.

8. Sputtering apparatus in accordance with claim 7 in which said target means is substantially flat.

9. Sputtering apparatus in accordance with claim 7 in which said target means is cylindrical.

10. Sputtering apparatus in accordance with claim 7 in which the exposed surface of said anode ring includes ribbed portions which shield other anode portions from exposure to sputtered material emitted from the target.

11. Sputtering apparatus in accordance with claim 1 in which said anode means is an annular channel shaped member having a restricted opening in the top thereof through which the electrons pass into the channel member.

12. Sputtering apparatus in accordance with claim 1 in which said anode means is an annular wire of refractory metal and which includes means for heating said anode wire to remove deposits which may form thereon.

13. Sputtering apparatus in accordance with claim 1 in which said target means is a cylindrical member whose axis extends substantially parallel to the electron discharge region and substantially coaxial with the substrate.

14. Sputtering apparatus in accordance with claim 1 which also includes an auxiliary target means positioned adjacent said anode and connected to a more negative potential than said anode, for coating said anode with conducting material sputtered from said auxiliary target to compensate for any insulating material sputtered onto said anode from the first mentioned target means and thereby maintain a conductive surface on said anode.

15. Sputtering apparatus comprising:
cathode means for emitting electrons;
anode means spaced from said cathode so that said electrons bombard said anode;

substrate means;
main target means for sputtering material from said target means onto said substrate means when said target means is bombarded with positive ions of sputtering gas; and
auxiliary target means separate from said main target and positioned adjacent to said anode, for sputtering electrically conductive material from said auxiliary target onto said anode to compensate for any insulative material sputtered onto said anode from said main target and to maintain a conductive surface on said anode.

* * * * *